(12) United States Patent
Zhu

(10) Patent No.: US 11,895,845 B2
(45) Date of Patent: Feb. 6, 2024

(54) MEMORY DEVICE AND METHOD FOR MANUFACTURING THE SAME, AND ELECTRONIC APPARATUS INCLUDING THE MEMORY DEVICE

(71) Applicant: Institute of Microelectronics, Chinese Academy of Sciences, Beijing (CN)

(72) Inventor: Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 485 days.

(21) Appl. No.: 17/309,222

(22) PCT Filed: Dec. 13, 2018

(86) PCT No.: PCT/CN2018/120889
§ 371 (c)(1),
(2) Date: May 7, 2021

(87) PCT Pub. No.: WO2020/093519
PCT Pub. Date: May 14, 2020

(65) Prior Publication Data
US 2021/0399018 A1 Dec. 23, 2021

(30) Foreign Application Priority Data
Nov. 9, 2018 (CN) .......................... 201811336212.1

(51) Int. Cl.
*H10B 51/20* (2023.01)
*H01L 21/28* (2006.01)
*H10B 43/27* (2023.01)

(52) U.S. Cl.
CPC ........ *H10B 51/20* (2023.02); *H01L 29/40111* (2019.08); *H01L 29/40117* (2019.08); *H10B 43/27* (2023.02)

(58) Field of Classification Search
CPC ........... H01L 29/4011; H01L 29/40117; H10B 43/27; H10B 43/50; H10B 51/20; H10B 51/50
See application file for complete search history.

(56) References Cited

U.S. PATENT DOCUMENTS

2013/0134377 A1 5/2013 Park et al.
2015/0060977 A1* 3/2015 Lee ..................... H01L 29/7827
257/314
(Continued)

FOREIGN PATENT DOCUMENTS

CN 104347379 A 2/2015
CN 104425511 A 3/2015
(Continued)

OTHER PUBLICATIONS

"Chinese Application Serial No. 201811336212.1, Office Action dated May 19, 2020", w/ English Translation, (dated May 19, 2020), 19.
(Continued)

*Primary Examiner* — Daniel P Shook
(74) *Attorney, Agent, or Firm* — Schwegman Lundberg & Woessner, P.A.

(57) ABSTRACT

A memory device and a method for manufacturing the same, and an electronic apparatus including the memory device are provided. The memory device may include: a substrate (1001); an electrode structure on the substrate (1001), in which the electrode structure includes a plurality of first electrode layers and a plurality of second electrode layers that are alternately stacked; a plurality of vertical active regions penetrating the electrode structure; a first gate dielectric layer and a second gate dielectric layer, in which the first gate dielectric layer is between the vertical active region and each first electrode layer of the electrode structure, and the second gate dielectric layer is between the vertical active region and each second electrode layer of the electrode structure, each of the first gate dielectric layer and the second gate dielectric layer constitutes a data memory
(Continued)

structure. A first effective work function of a combination of the first electrode layer and the first gate dielectric layer is different from a second effective work function of a combination of the second electrode layer and the second gate dielectric layer.

25 Claims, 11 Drawing Sheets

(56) References Cited

U.S. PATENT DOCUMENTS

| 2016/0043179 | A1 | 2/2016 | Noh et al. |
| 2016/0365384 | A1 | 12/2016 | Kim |

FOREIGN PATENT DOCUMENTS

| CN | 106298679 A | 1/2017 |
| CN | 106340521 A | 1/2017 |
| CN | 107017258 A | 8/2017 |
| CN | 108461496 A | 8/2018 |
| KR | 20140092015 A | 7/2014 |

OTHER PUBLICATIONS

Lin, Dianpeng, et al., "A novel highly reliable and low-power radiation hardened SRAM bit-cell design", IEICE Electronics Express 15.3, (2018), 4 pgs.

Noh, Yoohyun, et al., "A new metal control gate last process (MCGL process) for high performance DC-SF (dual control gate with surrounding floating gate) 3D NAND flash memory", 2012 Symposium on VLSI Technology (VLSIT). IEEE, (2012), pp. 19-20.

"International Application Serial No. PCT/CN2018/120889, International Search Report dated Jul. 31, 2019", w/ English Translation, (dated Jul. 31, 2019), 6 pgs.

"International Application Serial No. PCT/CN2018/120889, Written Opinion dated Jul. 31, 2019", (dated Jul. 31, 2019), 3 pgs.

* cited by examiner

US 11,895,845 B2

MEMORY DEVICE AND METHOD FOR MANUFACTURING THE SAME, AND ELECTRONIC APPARATUS INCLUDING THE MEMORY DEVICE

PRIORITY APPLICATIONS

This application is a U.S. National Stage Filing under 35 U.S.C. § 371 from International Application No. PCT/CN2018/120889, filed on Dec. 13, 2018, and published as WO2020/093519 on May 14, 2020, which claims the benefit of priority to Chinese Application No. 201811336212.1, filed on Nov. 9, 2018, entitled "MEMORY DEVICE AND METHOD FOR MANUFACTURING THE SAME, AND ELECTRONIC APPARATUS INCLUDING THE MEMORY DEVICE"; the benefit of priority of each of which is hereby claimed herein, and which applications and publication are hereby incorporated herein by reference in their entireties.

TECHNICAL FIELD

The present disclosure relates to a field of semiconductors, and in particular to a memory device based on a vertical device, a method for manufacturing the memory device, and an electronic apparatus including the memory device.

BACKGROUND

In a horizontal device such as a metal oxide semiconductor field effect transistor (MOSFET), a source, a gate and a drain are arranged in a direction that is substantially parallel to a surface of a substrate. Due to such an arrangement, it is difficult for the horizontal device to further shrink. Unlike this, in a vertical device, the source, the gate and the drain are arranged in a direction that is substantially perpendicular to the surface of the substrate. Thus, relative to the horizontal device, the vertical device is easier to shrink.

Based on the vertical device, a three-dimensional (3D) memory device, such as a flash memory (NAND type or NOR type) may be manufactured. Currently, with layers in a 3D memory device increasing, it is more and more difficult to further increase its integration density. In addition, it is difficult to reduce a source/drain resistance of a memory cell. Therefore, source/drain resistances of the memory cells that are vertically stacked are connected in series, which leads to an increase in a total resistance, and a poor performance of the memory device.

SUMMARY

In view of this, it is at least part of the purpose of the present disclosure to provide a memory device based on a vertical device with improved characteristics, a method for manufacturing the memory device, and an electronic apparatus including the memory device.

According to an aspect of the present disclosure, a memory device is provided, including: a substrate; an electrode structure on the substrate, wherein the electrode structure includes a plurality of first electrode layers and a plurality of second electrode layers that are alternately stacked; a plurality of vertical active regions penetrating the electrode structure; a first gate dielectric layer and a second gate dielectric layer, wherein the first gate dielectric layer is provided between the vertical active region and each first electrode layer in the electrode structure, and the second gate dielectric layer is provided between the vertical active region and each second electrode layer in the electrode structure, and each of the first gate dielectric layer and the second gate dielectric layer constitutes a data memory structure. A first effective work function of a combination of the first electrode layer and the first gate dielectric layer is different from a second effective work function of a combination of the second electrode layer and the second gate dielectric layer.

According to another aspect of the present disclosure, a method for manufacturing a memory device is provided, including: providing, on a substrate, a stack of a plurality of first sacrificial layers and a plurality of second sacrificial layers that are alternately stacked; forming a plurality of vertical holes penetrating the stack; forming a first gate dielectric layer corresponding to each first sacrificial layer and a second gate dielectric layer corresponding to each second sacrificial layer on a sidewall of each vertical hole; filling a semiconductor material in the plurality of vertical holes to form active regions; replacing the first sacrificial layer with a first electrode layer; and replacing the second sacrificial layer with a second electrode layer. A first effective work function of a combination of the first electrode layer and the first gate dielectric layer is different from a second effective work function of a combination of the second electrode layer and the second gate dielectric layer.

According to another aspect of the present disclosure, an electronic apparatus is provided, including the memory device described above.

According to the embodiments of the present disclosure, even the source/drain regions in the memory cell may be controlled by the corresponding electrode layer. Therefore, the source/drain resistance may be reduced, and thereby a total series resistance of the stacked memory cells is reduced. Therefore, a number of the stacked memory cells may be increased, and an integration density may be increased.

According to the embodiments of the present disclosure, a portion of the active region corresponding to each electrode layer may be used as a source or drain region in an aspect, and may be used as a channel region in another aspect. Compared with the technique of separately providing the channel region and the source/drain regions in a conventional device, the integration density may be increased.

BRIEF DESCRIPTION OF THE DRAWINGS

Through the following description of the embodiments of the present disclosure with reference to the accompanying drawings, the above and other objectives, features, and advantages of the present disclosure will become more apparent, wherein in the accompanying drawings.

Throughout the accompanying drawings, the same or similar reference numerals indicate the same or similar components.

DETAILED DESCRIPTION OF EMBODIMENTS

Figure 1:
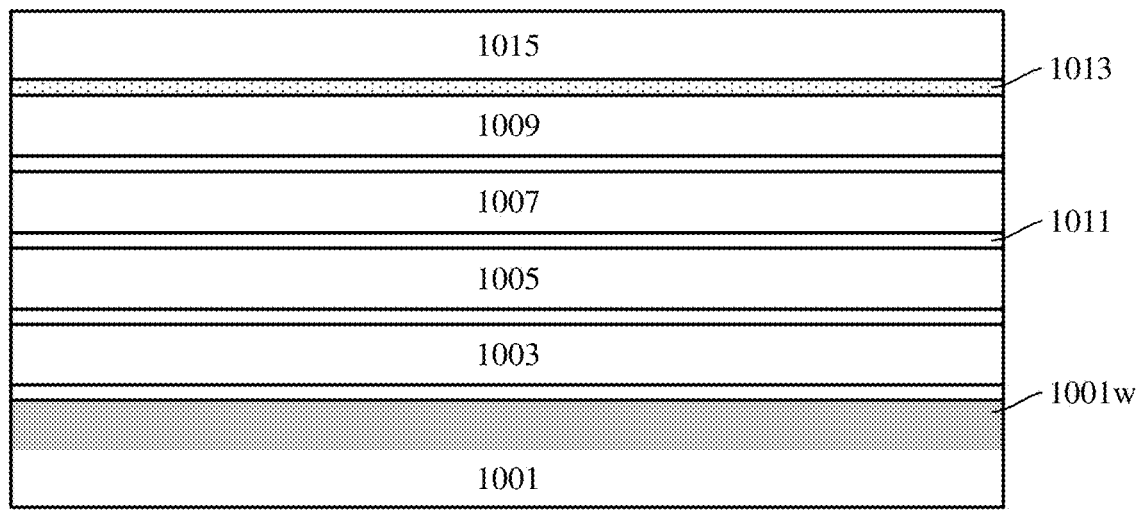
FIGS. 1 to 12(*b*) show schematic diagrams of some stages in a process for manufacturing a memory device according to the embodiments of the present disclosure.
Figure 2:
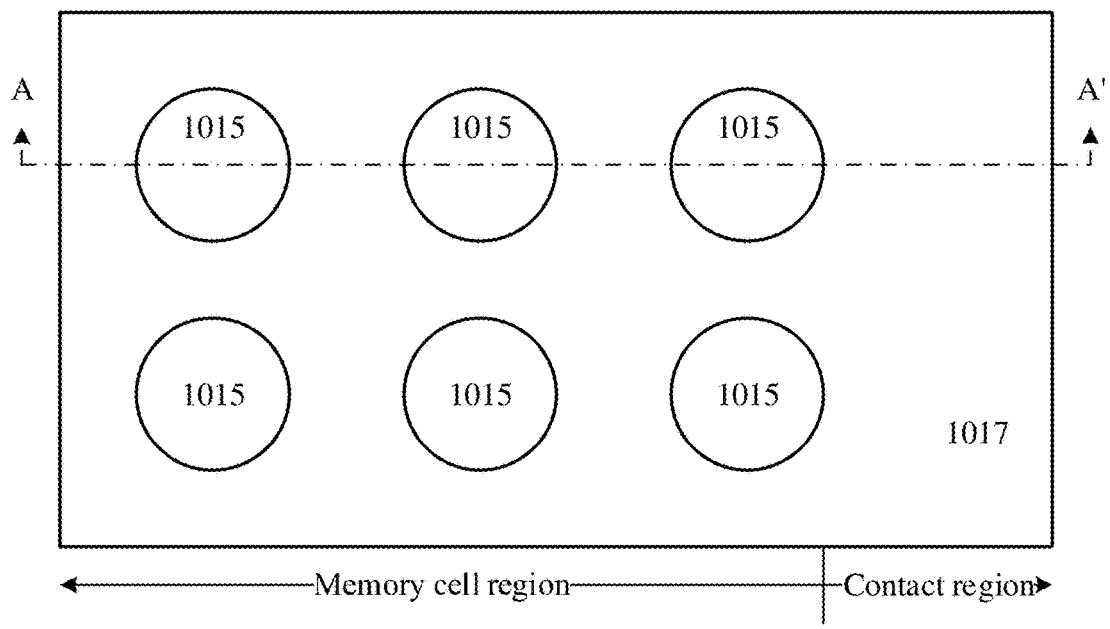

Hereinafter, the embodiments of the present disclosure will be described with reference to the accompanying drawings. However, it should be understood that these descriptions are only exemplary and are not intended to limit the scope of the present disclosure. In addition, in the following description, descriptions of well-known structures and technologies are omitted to avoid unnecessarily obscuring the concept of the present disclosure.

In the drawings, various structural schematic diagrams according to the embodiments of the present disclosure are shown. These drawings are not drawn to scale, some details are enlarged and some details may be omitted for clarity of presentation. Shapes of the various regions and layers, as well as the relative size and positional relationship between them which are shown in the drawings are only exemplary. In practice, there may be deviations due to manufacturing tolerances or technical limitations. Areas/layers with different shapes, sizes, and relative positions may be designed according to actual needs by those skilled in the art.

In the context of the present disclosure, when a layer/element is referred to as being "on" another layer/element, the layer/element may be directly on the another layer/element, or there may be an intermediate layer/element between them. In addition, if a layer/element is located "on" another layer/element in an orientation, the layer/element may be located "under" the another layer/element when the orientation is reversed.

The memory device according to the embodiments of the present disclosure is based on a vertical device, and thus may include a plurality of vertical active regions formed on the substrate and extending upward from the substrate vertically (e.g., substantially perpendicular to the surface of the substrate). The active region may be solid or hollow (which may be filled with dielectric). Based on these vertical active regions, a gate stack may be formed around their periphery to form a vertical device.

In a conventional vertical device, source/drain regions are respectively located on upper and lower sides of the channel region in the active region, a gate stack is formed around a periphery of the channel region, and a dielectric layer is usually formed around outer peripheries of the source/drain regions. That is, the channel region is controlled by the gate stack (especially a gate electrode therein), while there is no corresponding electrode to control the source/drain regions.

Unlike the above-mentioned conventional vertical device, according to the embodiments of the present disclosure, a control electrode (herein, it may also be referred to as a "gate electrode") corresponding to the source/drain regions may also be provided. The gate electrode used to control the source/drain regions may also be arranged in a form of a gate stack similar to the gate electrode used to control the channel region, that is, there is a gate dielectric layer between the gate electrode and the active region to be controlled. By controlling the source/drain regions through this gate electrode, source/drain resistances may be reduced.

The gate stack may be a memory gate stack to realize a memory function. More specifically, the gate dielectric layer may constitute a data memory structure. For example, the gate stack may include a gate dielectric layer formed on at least a part of a sidewall of the active region and a gate electrode layer opposite to the active region via the gate dielectric layer. The gate electrode layer may extend in a direction (for example, substantially parallel to a surface of the substrate) that intersects an extension direction of the vertical active region, so as to intersect the vertical active region.

For each gate stack, it may define a channel region in the vertical active region, and correspondingly define the source/drain regions, that is, portions of the active region that are located on opposite sides of the channel region. That is to say, a part of the vertical active region corresponding to each gate stack may be used as a channel region of a certain device or as a source or drain region of another device.

A multi-layer gate electrode layer which is arranged sequentially from bottom to top may be provided, thereby correspondingly defining a plurality of channel regions (and therefore a plurality of memory cells, each memory cell includes a corresponding channel region and source/drain regions on opposite sides of the channel region) in each vertical active region. The channel region of each memory cell may constitute a source or drain region of an adjacent memory cell. Here, the memory cell may be a flash cell. An insulating layer for electrical isolation may be provided between adjacent gate electrode layers. Of course, an electrical isolation between adjacent gate electrode layers may also be provided by the gate dielectric layer or a part of the gate dielectric layer. Compared with the conventional technology, the memory cells are arranged more densely, which may increase an integration density.

For such a configuration, in order to make each memory cell operate better, the gate stack for the channel region and the gate stack for the source/drain regions may have different effective work functions. For example, an effective work function of one of the gate stack for the channel region and the gate stack for the source/drain regions may be close to a conduction band of a semiconductor material of the active region, and an effective work function of another one of the gate stack for the channel region and the gate stack for the source/drain regions may be close to a valence band of the semiconductor material of the active region. Due to this difference in effective work function, a required carrier (electron or hole) distribution may be formed in the semiconductor material of the active region. Thus, the memory device may include an electrode structure formed by alternately stacking two electrode layers with different work functions, especially when the gate dielectric layers are the same.

The vertical active regions may be arranged in an array (for example, a two-dimensional array usually arranged in rows and columns). In addition, since the vertical active regions extend vertically on the substrate as described above and respectively define a multi-layer memory cell through the multi-layer gate electrode layer, and the memory device may be a three-dimensional (3D) array. In this 3D array, each vertical active region defines a string of memory cells.

In the present disclosure, the so-called "gate dielectric layer constituting the data memory structure" refers to a part of the gate stack between the gate electrode layer and the active region (or the channel region). The gate dielectric layer may be a stack, which has dielectric properties as a whole, that is, the gate electrode layer and the channel region are not directly electrically connected, so it is called a "dielectric", but this does not exclude that the gate dielectric layer may include one or more conductive layers. The gate dielectric layer may include a charge trapping layer or a ferroelectric material, etc., so as to achieve a memory function. For example, the gate dielectric layer may include a first dielectric layer, a charge trapping layer, and a second dielectric layer that are sequentially stacked, or may include a dielectric layer including a ferroelectric material, for example, such as, Hf oxide or Zr oxide. There are various memory gate stack configurations that may realize the memory function in the art, which will not be repeated here.

Such a memory device may be manufactured as follows, for example. Specifically, a stack in which a first sacrificial layer and a second sacrificial layer are alternately stacked may be provided on the substrate. In order to facilitate a subsequent replacement of the sacrificial layers, an etching stop layer may be provided between adjacent sacrificial layers. Then, several vertical holes may be formed in the stack. Subsequently, active regions may be formed in these holes (the active regions correspond to a shape of the holes, so that the active regions may be "columnar", including but not limited to cylindrical). These holes may extend along a stacking direction (vertical direction) of the stack and penetrate the stack.

A gate dielectric layer may be formed on a sidewall of a hole at least at a position corresponding to each sacrificial layer. For example, a first gate dielectric layer corresponding to the first sacrificial layer and a second gate dielectric layer corresponding to the second sacrificial layer may be respectively formed. The gate dielectric layer formed in this way and the gate electrode layer formed subsequently form a gate stack together. The hole may be filled with a (doped) semiconductor material, so as to form an active region. The semiconductor material may completely fill the hole to form a solid active region, or only form along an inner wall of the hole to form a hollow active region (an inner side of which may be further filled with a dielectric layer). The active region cooperates with each gate stack to form a memory cell.

The gate dielectric layer may be formed by depositing a corresponding material layer on the sidewall of the hole before filling the semiconductor material, or the gate dielectric layer may be formed by depositing a corresponding material layer on the sidewall (more specifically, on a surface of the semiconductor layer filled in the hole) of the hole after the semiconductor layer is filled, or a part of the gate stack may be formed before the semiconductor material is filled, and a remaining part may be formed after the semiconductor material is filled.

A vertical processing channel may be formed in the stack to expose each sacrificial layer. The sacrificial layers may be removed by selective etching and replaced with corresponding electrode layers. As described above, the first sacrificial layer may be replaced with the first electrode layer, and the second sacrificial layer may be replaced with the second electrode layer. An effective work function of a combination of the first electrode layer and a corresponding gate dielectric layer may be different from an effective work function of a combination of the second electrode layer and a corresponding gate dielectric layer. A work function of the first electrode layer may be different from a work function of the second electrode layer, especially when the gate dielectric layers are the same.

The present disclosure may be presented in various ways, some examples of which may be described below.

FIGS. 1 to 12(b) show schematic diagrams of some stages in a process for manufacturing a memory device according to the embodiments of the present disclosure.

As shown in FIG. 1, a substrate 1001 is provided. The substrate 1001 may be a substrate of various forms, including but not limited to a bulk semiconductor material substrate such as a bulk Si substrate, a semiconductor-on-insulator (SOI) substrate, a compound semiconductor substrate such as a SiGe substrate, and the like. In the following description, for ease of description, a bulk Si substrate is taken as an example for description.

A well region 1001w is formed in the substrate 1001 by, for example, ion implantation. The well region 1001w may be used as a common source/drain connection layer (for example, a common ground potential surface) of the memory device, and source/drain regions in a lower layer of each lowermost memory cell in a memory device may all be connected to the common source/drain connection layer. If the lowermost memory cell is an n-type device, the well region 1001w may be doped to be n-type; and if the memory cell is a p-type device, the well region 1001w may be doped to be p-type.

Alternate stacks of first sacrificial layers 1003, 1007 and second sacrificial layers 1005, 1009 may be sequentially formed on the substrate 1001 by, for example, deposition. The first sacrificial layers 1003, 1007 and the second sacrificial layers 1005, 1009 may include materials having etching selectivity with respect to each other. For example, the first sacrificial layers 1003, 1007 may include polysilicon with a thickness of about 10 to 100 nm; the second sacrificial layers 1005, 1009 may include polycrystalline SiGe (an atomic percentage of Ge is, for example, about 15 to 50%), with a thickness of about 10 to 100 nm. The first sacrificial layers 1003, 1007 and the second sacrificial layers 1005, 1009 may determine a thickness of source/drain regions controlled by a gate or a gate length. Therefore, in order to ensure a uniformity of a performance of the device, each of the first sacrificial layers 1003, 1007 and the second sacrificial layers 1005, 1009 may have substantially a same thickness. The steps of forming the first sacrificial layers and the second sacrificial layers may be repeated until a required number of layers is reached.

In addition, in order to better control the etching, an etching stop layer 1011 may be provided between adjacent layers of the first sacrificial layers 1003, 1007 and the second sacrificial layers 1005, 1009. In addition, the etching stop layer 1011 may also be provided between a lowermost first sacrificial layer 1003 and the substrate 1001. The etching stop layer 1011 may include a material having etching selectivity with respect to the first sacrificial layers 1003, 1007 and the second sacrificial layers 1005, 1009 (and the substrate 1001). In addition, the etching stop layer 1011 may include a dielectric material, so that the etching stop layer 1011 may be subsequently used for an electrical isolation between adjacent gate electrode layers. For example, the etching stop layer 1011 may include SiC with a thickness of about 1 to 5 nm.

In addition, in order to facilitate patterning in the subsequent processing and provide an appropriate stop layer and other purposes, a hard mask layer may also be formed on the grown layers. For example, the hard mask layer may include an oxide (for example, silicon oxide) layer 1013 with a thickness of, for example, about 2 to 10 nm, and a nitride (for example, silicon nitride) layer 1015 with a thickness of, for example, about 10 to 100 nm.

Subsequently, locations of the active regions may be defined. As shown in the top view of FIG. 2, the substrate may include a memory cell region and a contact region. Memory cells may be formed in the memory cell region, and various electrical contact portions may be formed in the contact region. Of course, the substrate may also include other regions, such as a circuit region for forming related circuits. In the memory cell region, a photoresist 1017 may be formed on the structure shown in FIG. 1. The photoresist 1017 is patterned to have openings at locations of the active regions, by photolithography (exposure and development), so as to expose the nitride layer 1015 under the photoresist 1017. A layout of the openings depends on a layout of the memory cells, for example, the openings may be arranged in rows and columns into a two-dimensional array.

Figure 3:
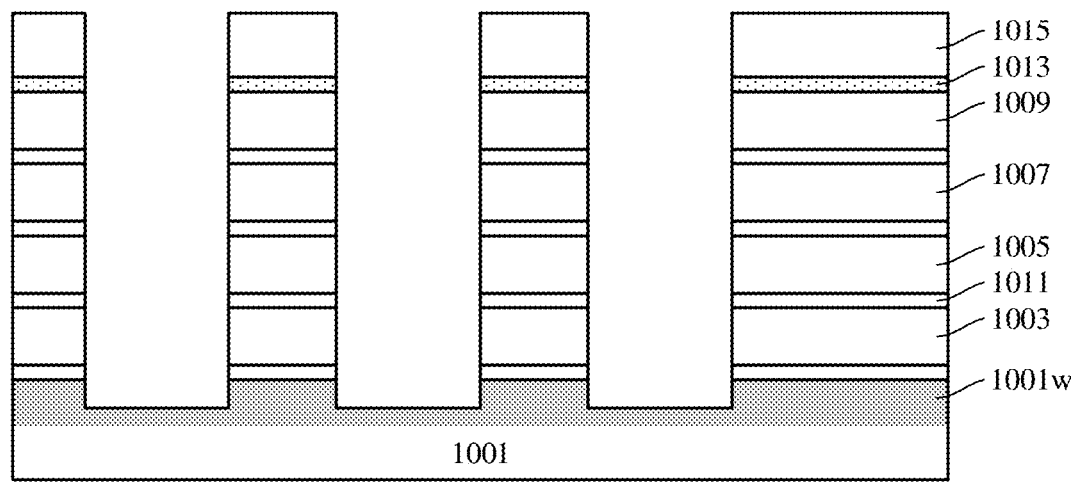

Next, as shown in FIG. 3 (a cross-sectional view along line AA' in FIG. 2), a hole may be opened downward through the photoresist 1017. Specifically, the hard mask layer (the nitride layer 1015 and the oxide layer 1013) and the alternately stacked first sacrificial layers, etching stop layers, and second sacrificial layers described above may be selectively etched sequentially by, such as, a reactive ion etching (ME) to form holes. For example, ME may be performed in a direction substantially perpendicular to a surface of the substrate, thereby obtaining holes extending in a direction substantially perpendicular to the surface of the substrate. After that, the photoresist 1017 may be removed. In this example, the holes may penetrate the stack of the first sacrificial layers and the second sacrificial layers, and expose the well region 1001w at the bottom.

Here, the hole is shown as a circular shape, but the present disclosure is not limited to this. The hole may be any shape suitable for processing.

Figure 4:
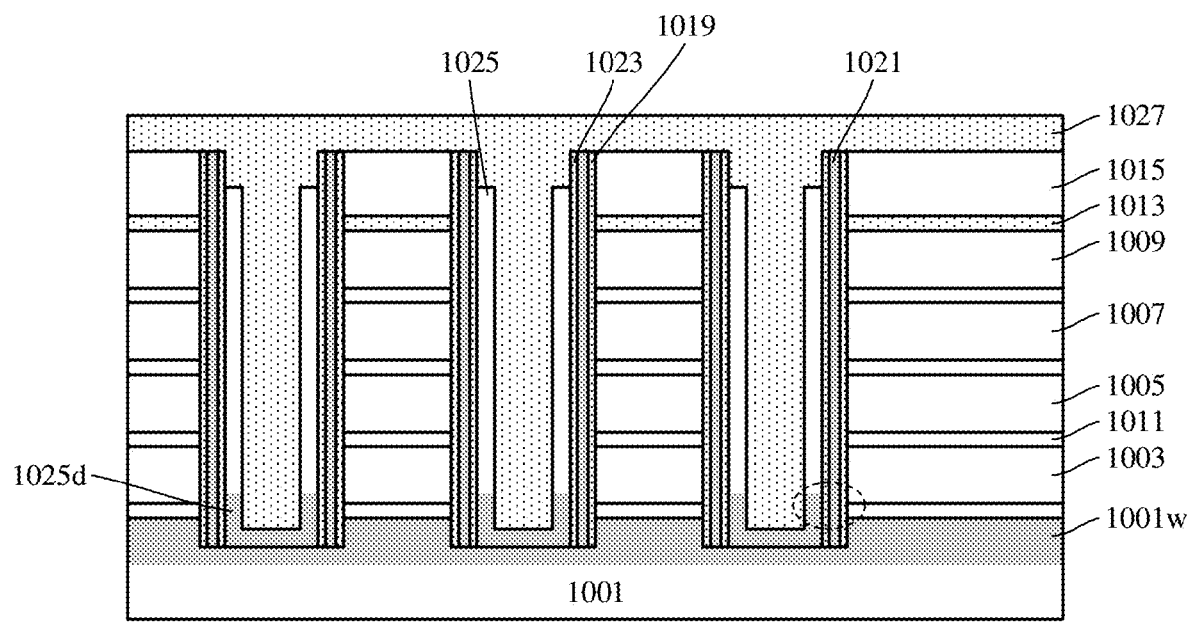

A gate dielectric layer may be formed along a sidewall of a hole. For example, a spacer formation process may be used to form a gate dielectric layer in a form of a spacer on the sidewall of the hole. According to the embodiments of the present disclosure, the gate dielectric layer may constitute a data memory structure. For example, the gate dielectric layer may include a first dielectric layer 1019 (for example, oxide or high-K dielectric such as $HfO_2$, with a thickness of about 1 to 10 nm), a charge trapping layer 1021 (for example, nitride, with a thickness of about 1 to 20 nm), and a second dielectric layer 1023 (for example, oxide or high-K dielectric, with a thickness of about 1 to 10 nm), as shown in FIG. 4. The gate dielectric layer of this stacked configuration may be formed by sequentially depositing the first dielectric layer 1019, the charge trapping layer 1021, and the second dielectric layer 1023 in a substantially conformal manner on the structure shown in FIG. 3, and by performing RIE on the first dielectric layer 1019, the charge trapping layer 1021, and the second dielectric layer 1023 in a vertical direction (for example, in a direction substantially perpendicular to the surface of the substrate). In this way, a gate dielectric layer continuously extending along the sidewall of the hole may be formed.

Then, a semiconductor material (for example, polysilicon) may be filled in the hole where the gate dielectric layer is formed on the sidewall of the hole, so as to form an active region. As shown in FIG. 4, the filled semiconductor material 1025 may extend substantially conformally along the sidewall and a bottom wall of the hole, with a thickness of, for example, about 4 to 20 nm, thereby forming a tubular structure with a closed bottom. Here, the semiconductor material 1025 may be undoped or not intentionally doped. Alternatively, the semiconductor material 1025 may be moderately doped (for example, a doping concentration is about 1E17 to 1E19 $cm^{-3}$, and a doping type may depend on specific device requirements) to adjust a threshold voltage of the device, reduce a device resistance, and the like.

For example, the semiconductor material 1025 may be filled into the hole by deposition, and in-situ doping may be performed while depositing. In this example, the filled semiconductor material 1025 may be relatively thin, and therefore the hole is not completely filled. The filled semiconductor material 1025 may also completely fill the hole. In a case that the hole is not completely filled, a dielectric material 1027, such as oxide, may be further filled in the hole. The semiconductor material 1025 (and the dielectric material 1027) may be subjected to a planarization treatment such as CMP to remove their parts outside the hole. For example, the planarization treatment may stop at the hard mask layer (the nitride layer 1015 of the hard mask layer). According to the embodiments of the present disclosure, the semiconductor material 1025 may also be etched back so that a top surface of the semiconductor material 1025 is lower than a top surface of the hard mask layer (and preferably higher than a top surface of an uppermost sacrificial layer). Then, a dielectric material (which may include a same material as the dielectric material 1027, which is shown as 1027 integrally with the dielectric material 1027 here) is further formed to completely fill a space formed in the hole due to the etching back of the semiconductor material 1025. The further formed dielectric material may exceed the top surface of the hard mask layer, and may be subjected to a planarization treatment such as CMP to have a relatively flat top surface.

According to the embodiments of the present disclosure, after the semiconductor material 1025 is filled and before the dielectric material 1027 is filled, a doped region 1025d may further be formed at the bottom of the semiconductor material 1025 (a part of the semiconductor material 1025 on the bottom wall of the hole) by, for example, ion implantation. The doped region 1025d may be doped into a same type as the well region 1001w, so that the doped region 1025d may have a reduced contact resistance with the well region 1001w (a common source/drain connection layer), and therefore may be used as a contact region between the active region and the source/drain connection layer. The doped region 1025d may overlap with a lowermost sacrificial layer in a lateral direction (a horizontal direction in the drawing), as shown by a dashed circle in FIG. 4, which facilitates reducing a resistance between the channel and the source/drain connection layer.

In this way, the semiconductor material 1025 forms a (columnar) active region. The active region is filled in the hole and extends vertically on the substrate like the hole. The semiconductor material 1025 in the active region is substantially homogeneous, and the contact region 1025d may be formed at the bottom.

Next, a replacement gate process may be performed to replace the first sacrificial layers and the second sacrificial layers with final gate electrode layers. In order to facilitate the replacement of the sacrificial layers, a processing channel may be formed in the stack to expose each sacrificial layer.

Figure 5:
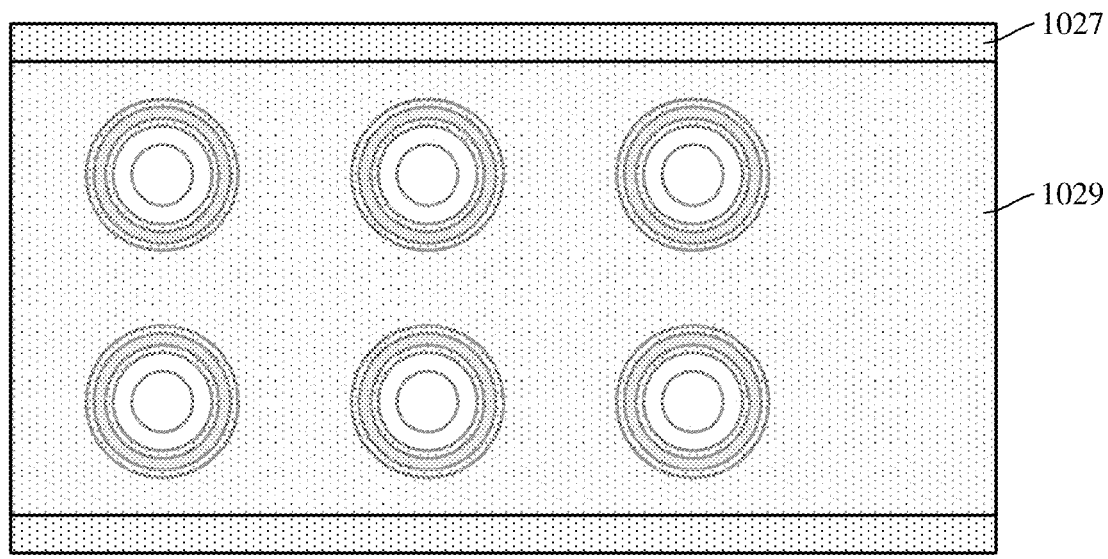

To this end, as shown in FIG. 5, a photoresist 1029 may be formed on the structure shown in FIG. 4, and the photoresist 1029 may be patterned by photolithography (exposure and development) to have openings to form processing channels. Here, the openings may be long strips extending in a direction (a horizontal direction in the drawing) from the memory cell region to the contact region. This is because the gate electrode layers subsequently formed need to extend from the memory cell region to the contact region (in order to connect to an interconnection structure in the contact region, thereby forming a required electrical connection). The above-mentioned openings do not destroy a continuity of the gate electrode layer in this direction. In the photoresist 1029, an opening extending in the row direction may be formed every several rows of active regions (here, the active regions arranged in the horizontal direction are referred to as a row).

Figure 6A:
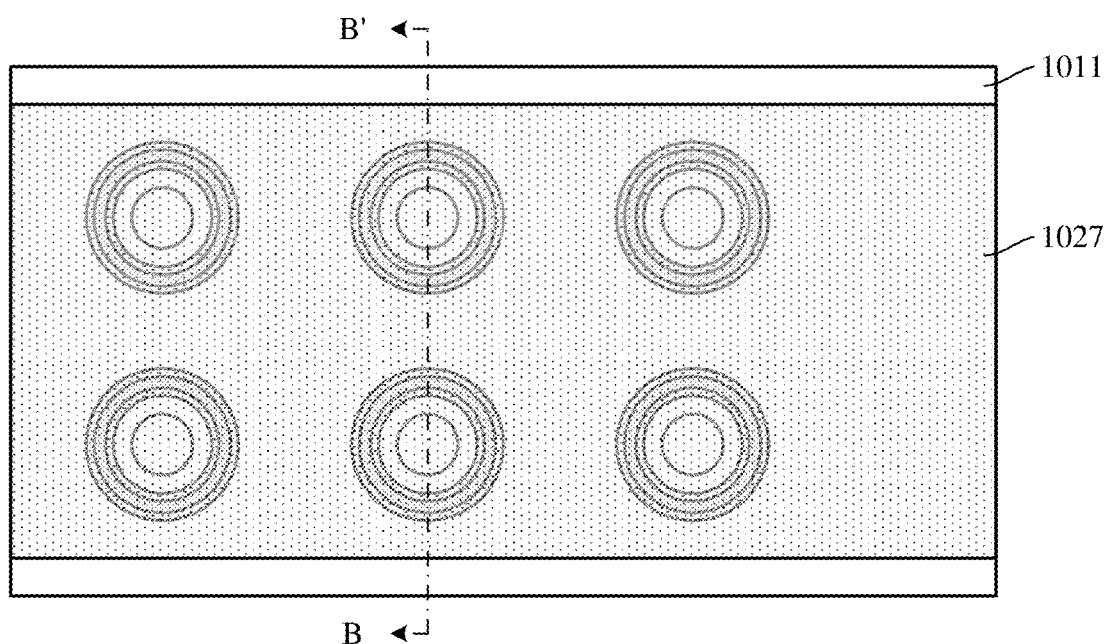
Figure 6B:
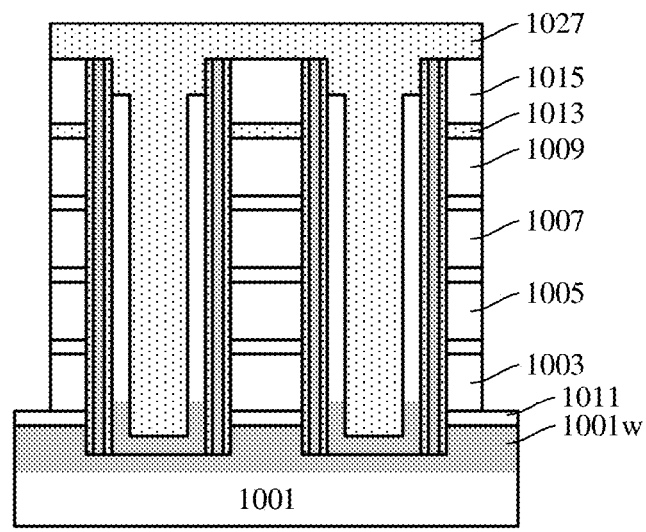

Then, as shown in FIGS. 6(a) and 6(b) (FIG. 6(a) is a top view, and FIG. 6(b) is a cross-sectional view along line BB' in FIG. 6(a)), slotting is performed downward through the photoresist 1029. Specifically, the hard mask layer (the nitride layer 1015 and the oxide layer 1013) and the above-mentioned alternately stacked first sacrificial layers, etching stop layers and second sacrificial layers may be selectively etched such as RIE in sequence to form processing channels.

For example, RIE may be performed in a direction substantially perpendicular to the surface of the substrate, thereby obtaining the processing channels extending in a direction substantially perpendicular to the surface of the substrate. RIE may stop at the lowermost etching stop layer 1011. After that, the photoresist 1029 may be removed. As shown in FIG. 6(*b*), the sacrificial layers 1003, 1005, 1007, and 1009 are exposed through the processing channels. Specifically, sidewalls of the sacrificial layers 1003, 1005, 1007, and 1009 are exposed in the processing channels.

Figure 7A:
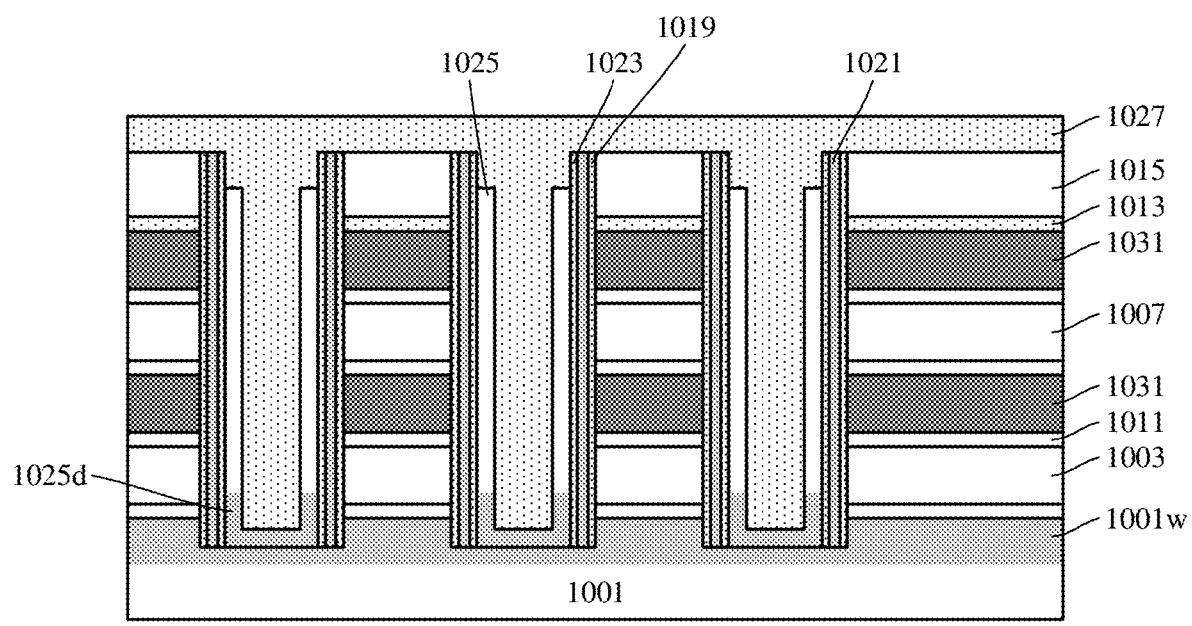
Figure 7B:
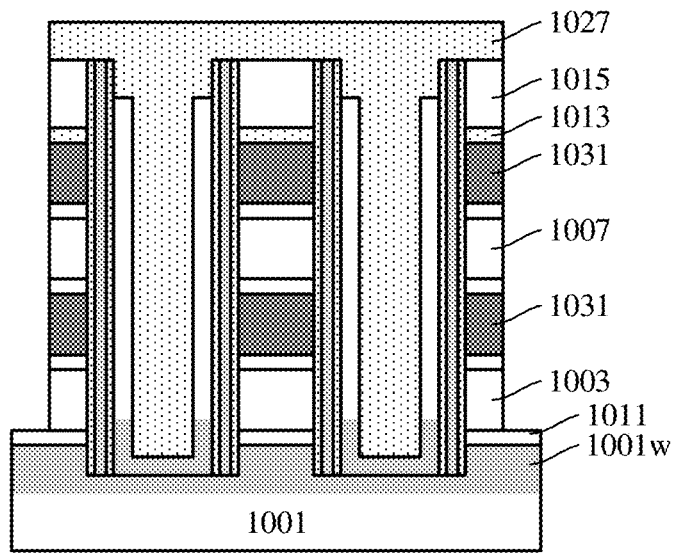

Next, as shown in FIGS. 7(*a*) and 7(*b*) (cross-sectional views along AA' line and BB' line, respectively), through the processing channels, the second sacrificial layers 1005, 1009 (here, polycrystalline SiGe) may be removed by selective etching relative to the first sacrificial layers 1003, 1007 (here, polycrystalline Si) and the etching stop layers 1011 (here, SiC). In a case that the second sacrificial layers 1005 and 1009 include polycrystalline SiGe as described above, the second sacrificial layers 1005 and 1009 may be removed by, for example, HCl (for example, gaseous HCl). In this way, spaces are left at positions where the second sacrificial layers 1005, 1009 are located. After that, a second gate electrode layer 1031 may be formed in the spaces through the processing channels, for example, by deposition and then RIE in the vertical direction. The second gate electrode layer 1031 may have a certain work function. For example, the second gate electrode layer 1031 may include metal, such as n-type metal such as TiN, TaN, TiCAl, TiAl, TiNAl, $TaC_x$.

Figure 8:
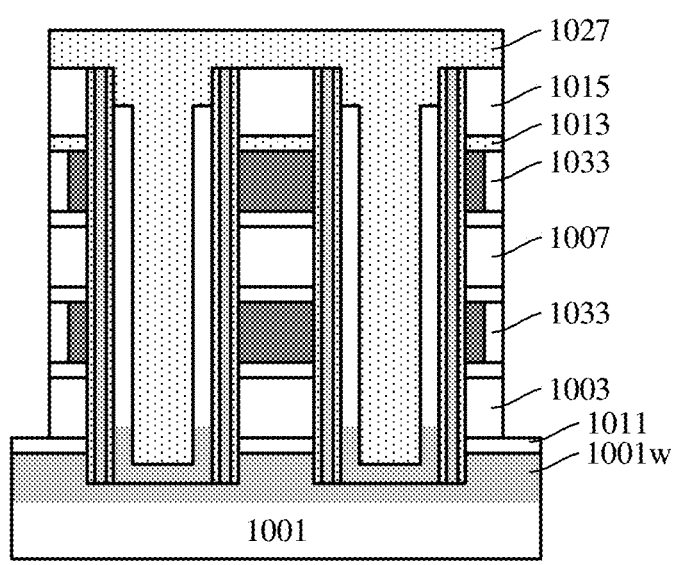

Similarly, the first sacrificial layers 1003 and 1007 may be replaced with a first gate electrode layer. In order to protect the second gate electrode layer 1031 during the replacement process, as shown in FIG. 8 (a cross-sectional view along line BB'), a protection layer 1033 may be formed on a sidewall of the second gate electrode layer 1031. For example, the second gate electrode layer 1031 may be etched back through the processing channels, so that the sidewall of the second gate electrode layer 1031 is relatively recessed. Then, for example, the protection layer 1033 is filled in this recess by deposition and then RIE in the vertical direction. The protection layer 1033 formed as such may be self-aligned to the second gate electrode layer 1031. The protection layer 1033 may include a material having a desired etching selectivity, such as nitride.

Figure 9A:
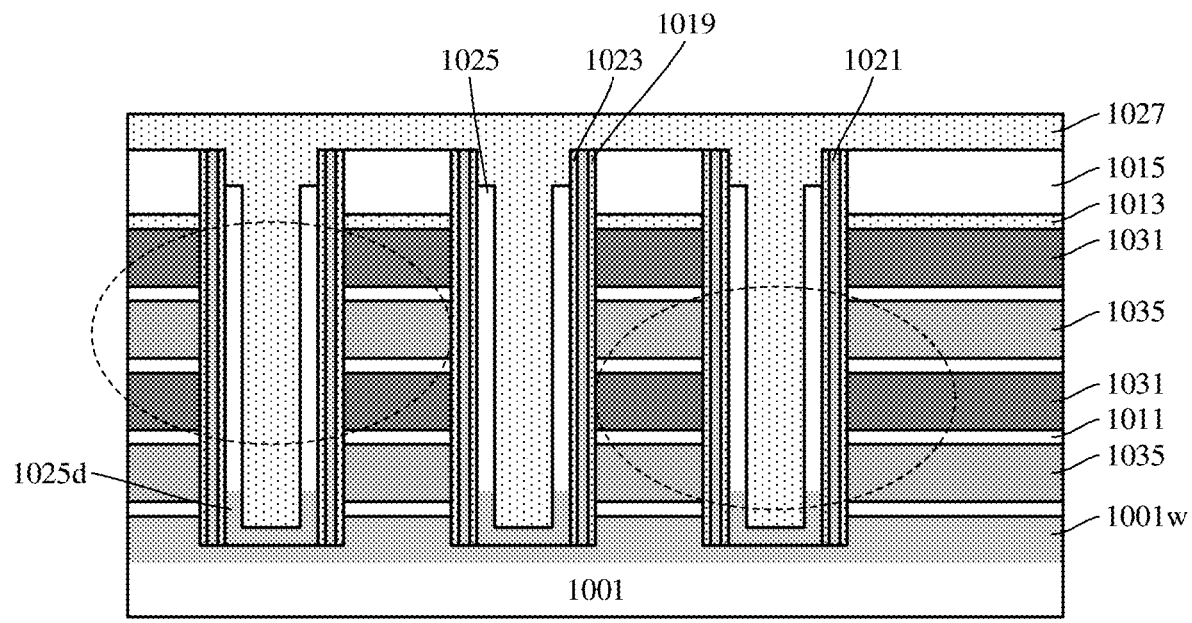
Figure 9B:
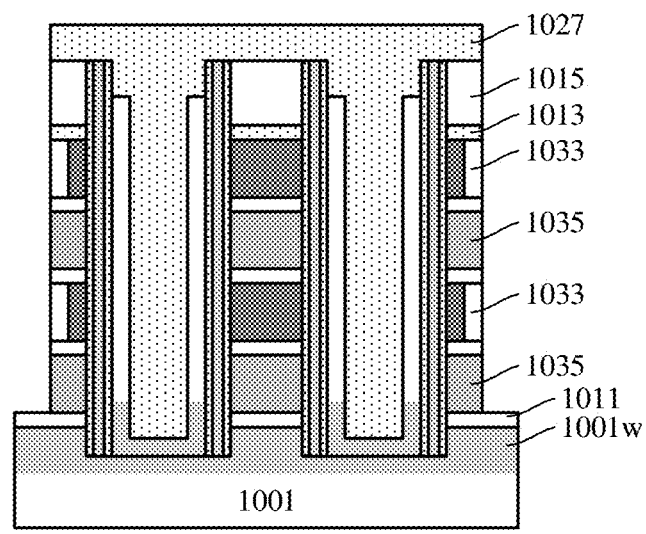

Then, as shown in FIGS. 9(*a*) and 9(*b*) (cross-sectional views along AA' line and BB' line, respectively), through the processing channels, the first sacrificial layers 1003 and 1007 (here, polycrystalline Si) may be removed by selective etching relative to the protection layers 1033 (here, nitride) and the etching stop layers 1011 (here, SiC). In a case that the first sacrificial layers 1003, 1007 include polysilicon as described above, the first sacrificial layers 1003, 1007 may be removed by, for example, a TMAH solution. In this way, spaces are left at positions where the first sacrificial layers 1003, 1007 are located. After that, the first gate electrode layer 1035 may be formed in the spaces through the processing channels, for example, by deposition and then RIE in the vertical direction. The first gate electrode layer 1035 may have a work function different from that of the second gate electrode layer 1031. For example, the first gate electrode layer 1035 may include metal, for example, p-type metal such as TiN, TaAl.

Each gate electrode layer 1031, 1035 may define a channel region in the active region. Therefore, in the memory cell region, a vertical string of memory cells is formed, and each memory cell includes a corresponding channel region and source/drain regions on the upper and lower sides of the channel region. In FIG. 9(*a*), an example of two upper and lower layers of the memory cells is shown by dashed circles. As shown in FIG. 9(*a*), the lower memory cell includes a channel region corresponding to the second gate electrode layer 1031 and source/drain regions on the upper and lower sides of the channel region. The source/drain regions are controlled by the first gate electrode layer 1035. Similarly, the upper memory cell includes a channel region corresponding to the first gate electrode layer 1035 and source/drain regions on the upper and lower sides of the channel region. The source/drain regions are controlled by the second gate electrode layer 1031.

According to the embodiments of the present disclosure, a two-layer memory cell configuration may be realized through a four-layer stacked structure on the substrate (the etching stop layers are relatively thin, thus are not counted here). The four-layer stacked structure includes the first sacrificial layer—the second sacrificial layer—the first sacrificial layer—the second sacrificial layer. However, in the conventional technology, at least a five-layer stacked structure on the substrate are required, that is, an insulating layer (corresponding to a source/drain region)—a sacrificial layer (subsequently replaced by a gate electrode layer)—an insulating layer (corresponding to a source/drain region)—a sacrificial layer (subsequently replaced by a gate electrode layer)—an insulating layer (corresponding to a source/drain region), and then the two-layer memory cell configuration may be realized. Therefore, an integration density may be increased.

In the above embodiments, the second sacrificial layer is replaced first, and then the first sacrificial layer is replaced. However, the present disclosure is not limited to this. For example, the first sacrificial layer may be replaced first, and then the second sacrificial layer may be replaced. In addition, in the above embodiments, the first gate electrode layer includes a p-type metal, and the second gate electrode layer includes an n-type metal. However, the present disclosure is not limited to this. For example, the first gate electrode layer may include an n-type metal, and the first gate electrode layer may include a p-type metal.

Subsequently, various electrical contact portions may be manufactured to realize required electrical connections. For a three-dimensional array, there is a plurality of ways to make interconnections in the art. For example, the electrode structure in the contact region may be patterned into a stepped shape, so as to form electrical contact portions to the gate electrode layers of each layer.

Figure 10A:
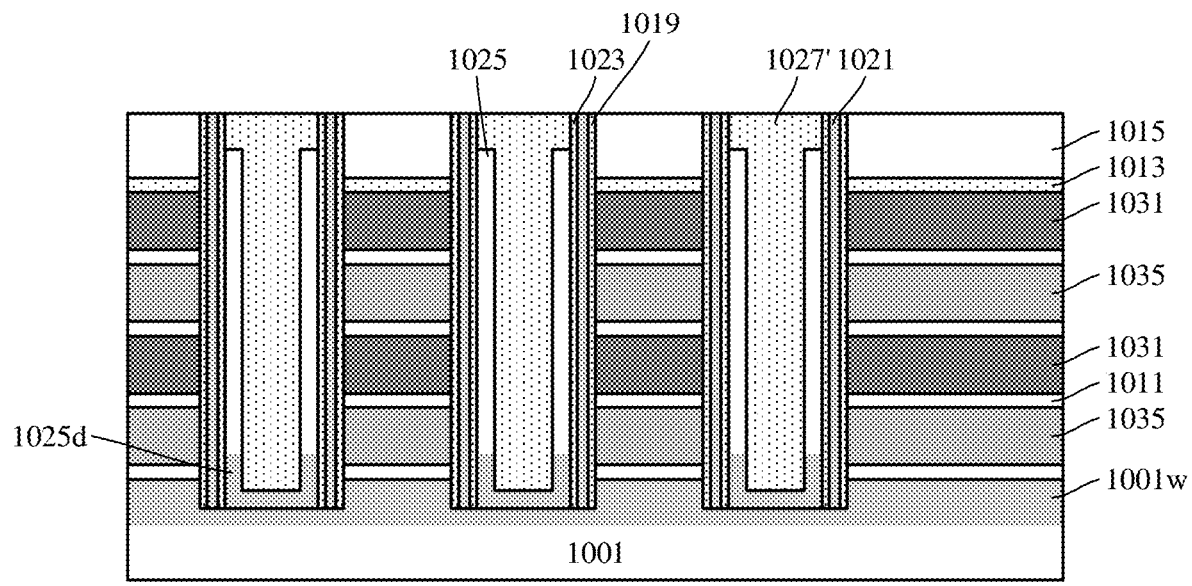
Figure 10B:
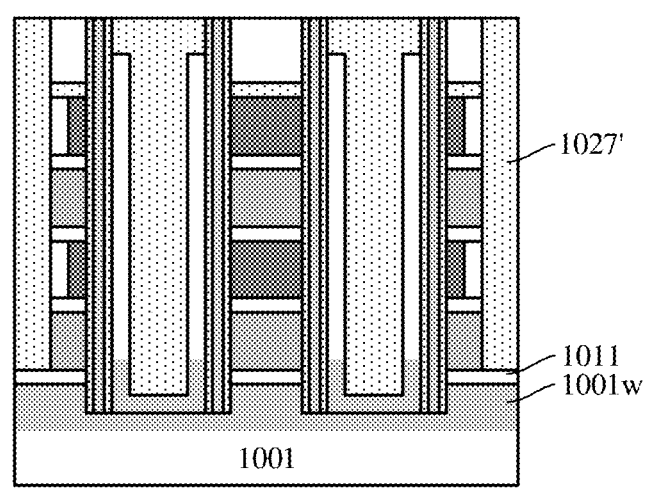

For this reason, as shown in FIGS. 10(*a*) and 10(*b*) (cross-sectional views along AA' line and BB' line, respectively), the processing channels may be further filled with a dielectric material to shield the formed electrode structures (the first gate electrode layer and the second gate electrode layer). For example, the filled dielectric material may be the same as the dielectric material 1027 described above. The dielectric material may be subjected to a planarization treatment such as CMP, and CMP may stop at the hard mask layer (the nitride layer 1015 in the hard mask layer) to obtain the dielectric layer 1027'.

Figure 11:
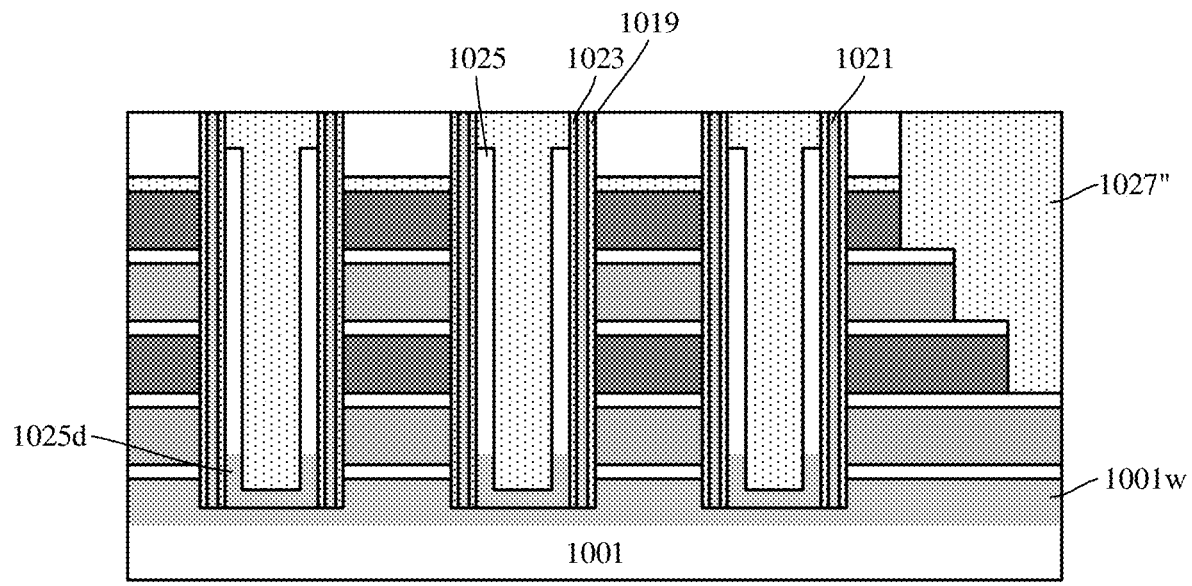

Then, as shown in FIG. 11 (a cross-sectional view along line AA'), the electrode structures may be etched by trimming the photoresist and using the photoresist as an etching mask, and the electrode structures in the contact region may be patterned into a stepped shape. In a gap caused by the electrode structures being patterned into the stepped shape, a dielectric material (which may be the same as the dielectric material 1027) may be further filled to obtain a dielectric layer 1027".

Figure 12A:
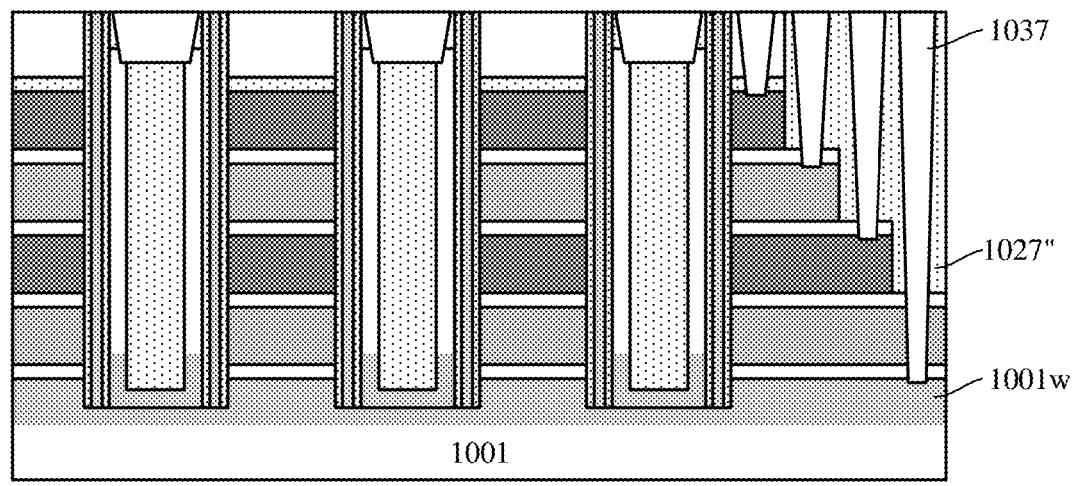
Figure 12B:
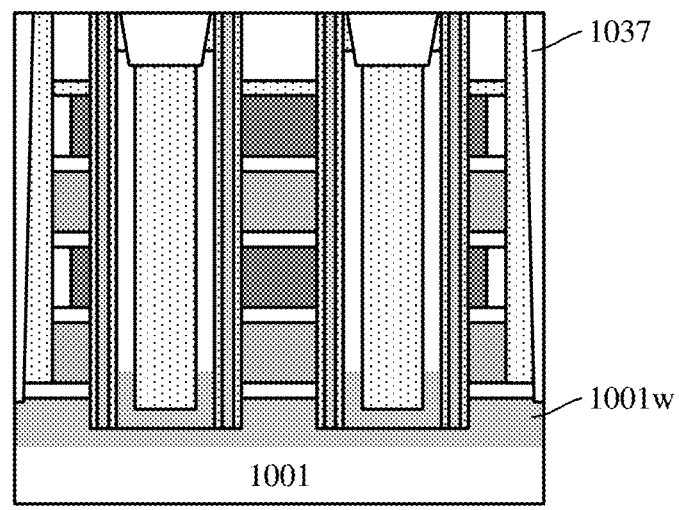

As shown in FIGS. 12(a) and 12(b) (cross-sectional views along AA' line and BB' line, respectively), in the dielectric layer 1027", electrical contact portions to the common source/drain connection layer 1001w (and therefore to the source/drain regions of each lowermost memory cell), electrical contact portions to each gate electrode layer, and electrical contact portions 1037 to the source/drain regions of each uppermost memory cell. Such electrical contact portions may be made by forming contact holes in the dielectric layer and filling the contact holes with a conductive material such as tungsten (W). In addition, before filling the conductive material, a diffusion barrier layer such as TiN may be formed on sidewalls of the contact holes.

Thus, the memory device according to the embodiments is obtained. As shown in FIGS. 12(a) and 12(b), the memory device may include a plurality of memory cell layers (in this example, only two layers are shown), and each memory cell layer includes an array of the memory cells. Each memory cell includes a channel region opposite to a corresponding gate electrode layer and source/drain regions on both sides of the channel region. The source/drain regions are also controlled by a corresponding gate electrode layer. The memory cells extending in the vertical direction in the same active region are connected in a string in a vertical direction, and is connected to a corresponding electrical contact portion at the upper end, and connected to the common source/drain connection layer at the lower end. The memory cells in each layer share the same gate electrode layer.

Through the electrical contact portions to the gate electrode layer, a certain memory cell layer may be selected. In addition, a certain memory cell string may be selected through source/drain contact portions.

In this example, electrical contact portions are formed for the source/drain regions of each memory cell in the uppermost layer. Due to a high density of the memory cells, a density of such source/drain contact portions is relatively high. According to another embodiment, it is possible to form electrodes arranged in rows (or columns) electrically connected to the source/drain regions of the lowermost memory cell, and to form electrodes arranged in columns (or rows) electrically connected to the source/drain regions of the uppermost memory cell. In this way, through the electrodes on the upper side and the electrodes on the lower side (crossing each other to form an array corresponding to the memory cell array), the corresponding memory cell string may be selected.

In addition, according to the embodiments of the present disclosure, a selection transistor may be added at the uppermost end and/or the lowermost end of the active region, which will not be repeated here. This selection transistor may also be a vertical device.

Hereinafter, the working principle of the memory device according to the embodiments of the present disclosure will be explained in conjunction with FIGS. 13, 14(a) and 14(b).

Figure 13:
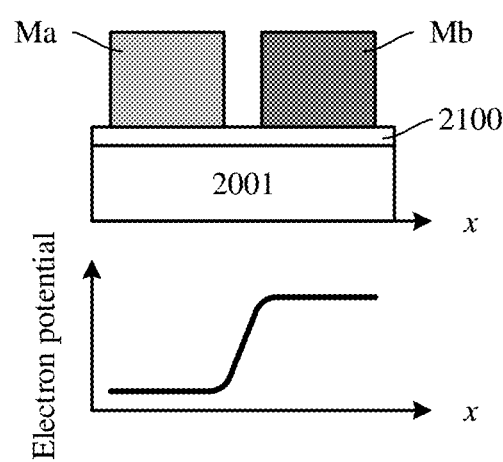
FIGS. 13, 14(*a*) and 14(*b*) show schematic diagrams of a working principle of a memory device according to the embodiments of the present disclosure.

FIG. 13 shows the effect of gate stacks with different effective work functions on semiconductor materials.

As shown in FIG. 13, a first electrode layer Ma and a second electrode layer Mb are provided on a semiconductor material 2001 (for example, Si). A (gate) dielectric layer 2100 is provided between the first electrode layer Ma, the second electrode layer Mb and the semiconductor material 2001. The first electrode layer Ma and the gate dielectric layer 2100 form a first gate stack, and the second electrode layer Mb and the gate dielectric layer 2100 form a second gate stack. The first gate stack and the second gate stack have different effective work functions. In this example, since the first gate stack and the second gate stack have the same gate dielectric layer 2100, so that the first electrode layer Ma and the second electrode layer Mb may have different work functions, so as to provide the first gate stack and the second gate stack with different effective work functions. Due to the different effective work functions, different electric fields may be caused in the semiconductor material 2001, and therefore corresponding (electron or hole) carrier distributions may be caused. If the effective work function of the first gate stack is closer to the conduction band energy level of the semiconductor material 2001, and the effective work function of the second gate stack is closer to the valence band energy level of the semiconductor material 2001, an electron potential may be obtained as shown in FIG. 13, that is, an electron concentration in a portion of the semiconductor material 2001 corresponding to the first gate stack may be higher than an electron concentration in a portion of the semiconductor material 2001 corresponding to the second gate stack. Thus, the portion of the semiconductor material 2001 corresponding to the first gate stack may be used as an n-type semiconductor, and the portion of the semiconductor material 2001 corresponding to the second gate stack may be used as a p-type semiconductor.

Figure 14A:
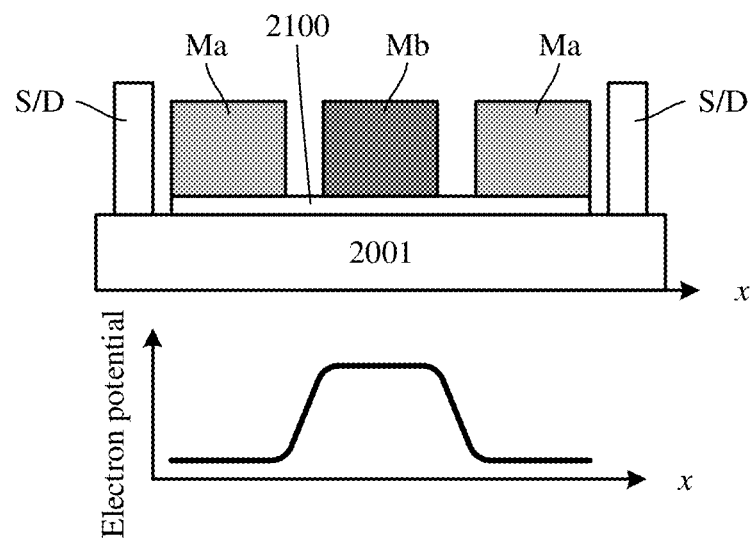
Figure 14B:
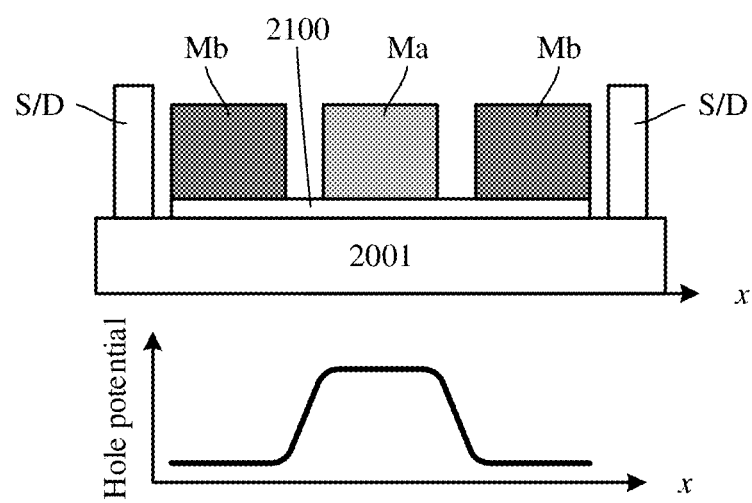

FIGS. 14(a) and 14(b) respectively show a configuration of an n-type device and a p-type device according to the embodiments of the present disclosure.

As shown in FIG. 14(a), a first electrode layer Ma, a second electrode layer Mb, and a first electrode layer Ma are formed adjacent to each other on a gate dielectric layer 2100 formed on a surface of a semiconductor material 2001. Since the first electrode layer Ma and the second electrode layer Mb have different work functions, they are combined with the gate dielectric layer 2100 to provide different effective work functions. Thus, as described above, an electron potential as shown in the drawing may be established in the semiconductor material 2001. In other words, a structure in which an n-type semiconductor, a p-type semiconductor, and an n-type semiconductor arranged adjacently is formed in the semiconductor material 2001, which is a characteristic of an n-type device.

Similarly, as shown in FIG. 14(b), an electron potential as shown in the drawing may be established in the semiconductor material 2001 by sequentially providing the second electrode layer Mb, the first electrode layer Ma, and the second electrode layer Mb. In other words, a structure in which a p-type semiconductor, an n-type semiconductor, and a p-type semiconductor arranged adjacently is formed in the semiconductor material 2001, which is a characteristic of a p-type device.

Therefore, the memory cell string described in the above embodiments may be a series connection of p-type devices or n-type devices, which is a conventional NAND structure. The read and write operations of this memory device may be the same as a conventional 3D NAND flash memory. The only difference is that the first gate electrode layer and the second gate electrode layer need to be applied with a voltage, so that a series structure of a p-type device or an n-type device is formed at least in a state of storing 0 or a state of the absolute value of the threshold voltage in the memory cell string being the greatest, that is, the corresponding memory cell is in an off state. For example, when a charge information stored in the gate dielectric layer corresponding to the first gate electrode layer is read, all the second gate electrode layers may be applied with a voltage, so that the active regions under the control of the second gate electrode layers become n-type semiconductors or p-type semiconductors, while all the first gate electrode layers are applied with a voltage at the same time, so that the active regions under the control of the first gate electrode layers become p-type semiconductors or n-type semiconductors in the state of storing 0 or the state of the absolute value of the threshold voltage being the greatest. When the voltage of all the second gate electrode layers is unchanged (or the control regions thereof is maintained as n-type semiconductors or p-type semiconductors), the first gate electrode layer is used as a gate to perform read and write operations to complete the read and write. In the same way, similar read and write operations may be performed on the second gate electrode.

Figure 15A:
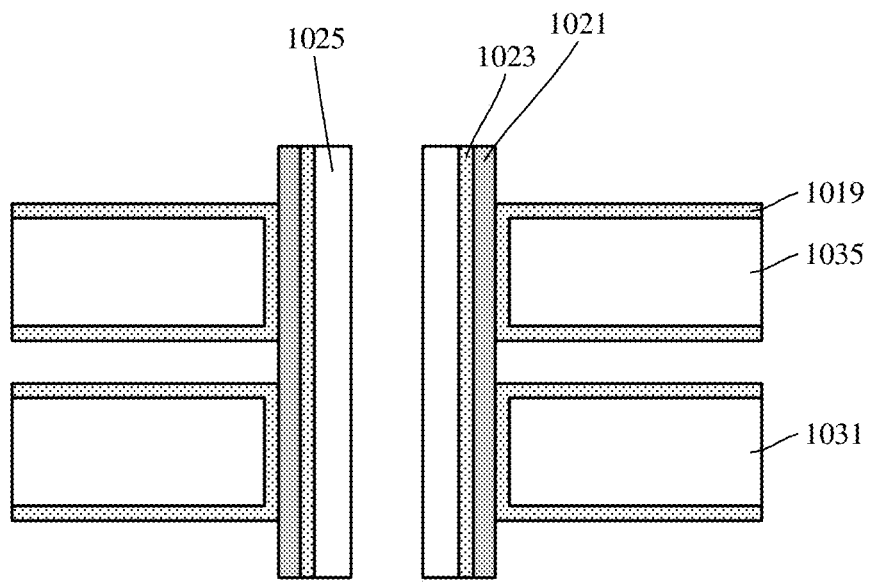
FIGS. 15(*a*) and 15(*b*) show schematic diagrams of different configurations of gate dielectric layers according to the embodiments of the present disclosure.
Figure 15B:
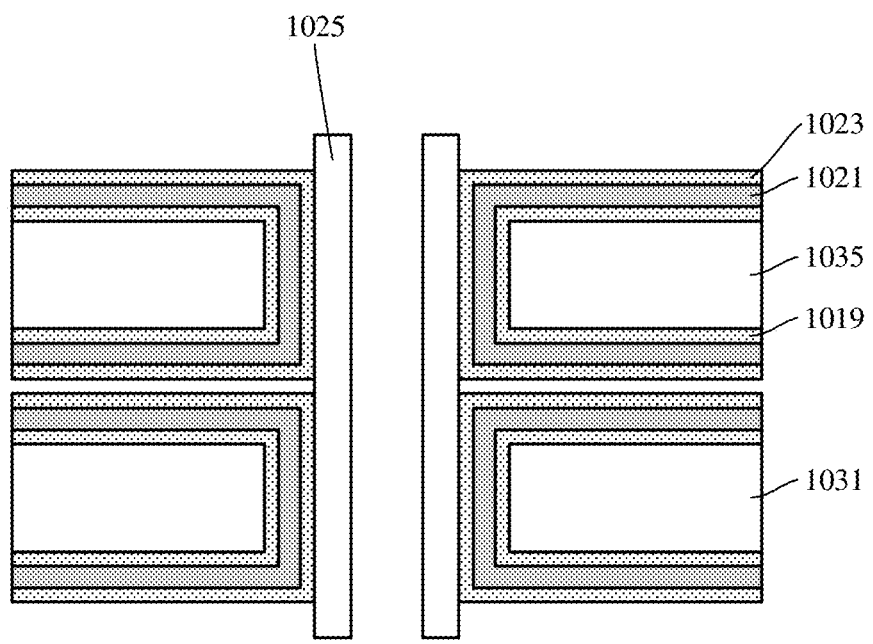

In the above embodiments, the gate dielectric layer is first formed along the sidewall of the hole, and then the semiconductor material is filled in the hole to form the active region. However, the present disclosure is not limited to this. For example, a part of the gate dielectric layer may be formed along the sidewall of the hole, and then other parts of the gate dielectric layer may be formed when the gate electrode layer is formed. For example, as shown in FIG. 15(a), a charge trapping layer 1021 and a second dielectric layer 1023 may be formed along the sidewall of the hole, and then after removing the sacrificial layer and before filling the gate electrode layer, the first dielectric layer 1019 is formed first. Alternatively, the gate dielectric layer may not be formed before the semiconductor material is filled, and then the gate dielectric layer may be formed when the gate electrode layer is formed. For example, as shown in FIG. 15(b), after removing the sacrificial layer and before filling the gate electrode layer, a stack of the second dielectric layer 1023, the charge trapping layer 1021 and the first dielectric layer 1019 may be formed first.

In the above example, the case that the gate dielectric layers are the same but the gate electrode layers have different work functions is explained. However, the present disclosure is not limited to this. For example, the gate dielectric layers may be different. As long as the gate electrode layer and the gate dielectric layer may provide different effective work functions. In addition, the gate electrode layer is not limited to a single-layer structure, and may also include a stack.

The memory device according to the embodiments of the present disclosure may be applied to various electronic devices. For example, the memory device may store various programs, applications, and data required for the operation of the electronic device. The electronic device may further include a processor cooperating with the memory device. For example, the processor may operate the electronic device by allowing the program stored in the memory device. Such electronic device includes smart phones, computers, tablet computers (PCs), wearable smart apparatuses, mobile power supplies, robots, smart chips, and so on.

In the above description, the technical details such as patterning and etching of each layer have not been described in detail. However, those skilled in the art should understand that, various technical means may be used to form layers, regions, etc., of a desired shape. In addition, in order to form the same structure, those skilled in the art may also design a method that is not completely the same as the method described above. In addition, although the respective embodiments are described above, this does not mean that the measures in the respective embodiments may not be advantageously used in combination.

The embodiments of the present disclosure have been described above. However, these embodiments are for illustrative purposes only, and are not intended to limit the scope of the present disclosure. The scope of the present disclosure is defined by the appended claims and their equivalents. Without departing from the scope of the present disclosure, those skilled in the art may make various substitutions and modifications, and these substitutions and modifications should fall within the scope of the present disclosure.

What is claimed is:

1. A memory device, comprising:
a substrate;
an electrode structure on the substrate, wherein the electrode structure comprises a plurality of first electrode layers and a plurality of second electrode layers that are alternately stacked;
a plurality of vertical active regions penetrating the electrode structure;
a first gate dielectric layer and a second gate dielectric layer, wherein the first gate dielectric layer is provided between the vertical active region and each first electrode layer in the electrode structure, and the second gate dielectric layer is provided between the vertical active region and each second electrode layer in the electrode structure, and each of the first gate dielectric layer and the second gate dielectric layer constitutes a data memory structure,
wherein a first effective work function of a combination of the first electrode layer and the first gate dielectric layer is different from a second effective work function of a combination of the second electrode layer and the second gate dielectric layer.

2. The memory device according to claim 1, wherein the first effective work function is close to a conduction band energy level of a semiconductor material in the vertical active region, and the second effective work function is close to a valence band energy level of the semiconductor material in the vertical active region; or the first effective work function is close to a valence band energy level of a semiconductor material in the vertical active region, and the second effective work function is close to a conduction band energy level of the semiconductor material in the vertical active region.

3. The memory device according to claim 1, further comprising an insulating layer between the first electrode layer and the second electrode layer.

4. The memory device according to claim 1, wherein each of the first gate dielectric layer and the second gate dielectric layer comprises a stack of a first dielectric layer, a charge trapping layer, and a second dielectric layer.

5. The memory device according to claim 4, wherein the first gate dielectric layer and the second gate dielectric layer comprise a same stack of the first dielectric layer, the charge trapping layer, the second dielectric layer, and the first dielectric layer, the charge trapping layer and the second dielectric layer extend continuously along a sidewall of the vertical active region.

6. The memory device according to claim 4, wherein the first dielectric layer in the stack is close to the vertical active region, and the second dielectric layer in the stack is close to the electrode structure; and
wherein the first dielectric layer and the charge trapping layer in the stack of the first gate dielectric layer are respectively arranged in same layers as the first dielectric layer and the charge trapping layer in the stack of the second gate dielectric layer, and
the first dielectric layer and the charge trapping layer both extend along a sidewall of the vertical active region, and the second dielectric layer in the stack of each of the first gate dielectric layer and the second gate dielectric layer extends along a sidewall, an upper surface and a lower surface of a corresponding electrode layer.

7. The memory device according to claim 4, wherein the first gate dielectric layer extends along a sidewall, an upper surface and a lower surface of each first electrode layer, and the second gate dielectric layer extends along a sidewall, an upper surface and a lower surface of each second electrode layer.

8. The memory device according to claim 1, further comprising:
a contact region, wherein the contact region is formed on the substrate, and is in contact with a bottom end of each vertical active region.

9. The memory device according to claim 8, wherein a semiconductor material in the vertical active region is doped, at least at a bottom end of the semiconductor material, into a same conductive type as the contact region, and the doped portion overlaps with a lowermost electrode layer of the first electrode layer and the second electrode layer in a lateral direction.

10. The memory device according to claim 1, wherein a semiconductor material in the vertical active region has a tubular shape with a closed bottom.

11. The memory device according to claim 1, wherein a portion of the vertical active region corresponding to each first electrode layer and portions of the vertical active region corresponding to the upper and lower second electrode layers adjacent to the each first electrode layer respectively constitute a channel region and source/drain regions of a same device; and
wherein a portion of the vertical active region corresponding to each second electrode layer and portions of the vertical active region corresponding to the upper and lower first electrode layers adjacent to the second electrode layer respectively constitute a channel region and source/drain regions of a same device.

12. The memory device according to claim 1, wherein each of the first gate dielectric layer and the second gate dielectric layer is a dielectric layer comprising a ferroelectric material.

13. An electronic apparatus, comprising the memory device according to claim 1.

14. The electronic apparatus according to claim 13, wherein the electronic apparatus comprises a smart phone, a computer, a tablet computer, a wearable smart apparatus, a mobile power supply, a robot and a smart chip.

15. The method for manufacturing a memory device, comprising:
providing, on a substrate, a stack of a plurality of first sacrificial layers and a plurality of second sacrificial layers that are alternately stacked;
forming a plurality of vertical holes penetrating the stack;
forming a first gate dielectric layer corresponding to each first sacrificial layer and a second gate dielectric layer corresponding to each second sacrificial layer on a sidewall of each vertical hole;
filling a semiconductor material in the plurality of vertical holes to form active regions;
replacing the each first sacrificial layer with a first electrode layer; and
replacing the each second sacrificial layer with a second electrode layer,
wherein a first effective work function of a combination of the first electrode layer and the first gate dielectric layer is different from a second effective work function of a combination of the second electrode layer and the second gate dielectric layer.

16. The method according to claim 15, wherein
the first effective work function is close to a conduction band energy level of the semiconductor material in the vertical active region, and the second effective work function is close to a valence band energy level of the semiconductor material in the vertical active region; or
the first effective work function is close to a valence band energy level of the semiconductor material in the vertical active region, and the second effective work function is close to a conduction band energy level of the semiconductor material in the vertical active region.

17. The method according to claim 15, wherein providing the stack further comprises:
providing an etching stop layer of a dielectric between adjacent first sacrificial layer and second sacrificial layer.

18. The method according to claim 15, wherein forming the first gate dielectric layer and the second gate dielectric layer comprises:
forming a stack of a first dielectric layer, a charge trapping layer, and a second dielectric layer.

19. The method according to claim 18, wherein the first gate dielectric layer and the second gate dielectric layer comprise a same stack of the first dielectric layer, the charge trapping layer, and the second dielectric layer; and
wherein the forming the first gate dielectric layer and the second gate dielectric layer comprises:
before filling the semiconductor material, forming the stack that extends continuously along a sidewall of the each vertical hole.

20. The method according to claim 18, wherein the first dielectric layer in the stack is close to the vertical active region, the second dielectric layer in the stack is close to the electrode structure, and the first dielectric layer and the charge trapping layer in the stack of the first gate dielectric layer are respectively arranged in same layers as the first dielectric layer and the charge trapping layer in the stack of the second gate dielectric layer; and
wherein the forming the first gate dielectric layer and the second gate dielectric layer comprises:
before filling the semiconductor material, forming the charge trapping layer and the first dielectric layer that extend continuously along a sidewall of the each vertical hole;
when replacing the first sacrificial layer, forming the second dielectric layer of the first gate dielectric layer on a sidewall of the charge trapping layer formed on the sidewall of the each vertical hole; and
when replacing the second sacrificial layer, forming the second dielectric layer of the second gate dielectric layer on a sidewall of the charge trapping layer formed on the sidewall of the each vertical hole.

21. The method according to claim 18, wherein the forming the first gate dielectric layer and the second gate dielectric layer comprises:
when replacing the first sacrificial layer, forming the stack of the first gate dielectric layer on a sidewall of the semiconductor material filled in the each vertical hole; and
when replacing the second sacrificial layer, forming the stack of the second gate dielectric layer on a sidewall of the semiconductor material filled in the each vertical hole.

22. The method according to claim 15, wherein forming the first gate dielectric layer and the second gate dielectric layer comprises:
   forming a dielectric layer comprising a ferroelectric material.

23. The method according to claim 15, further comprising:
   before forming the stack, forming a well region on the substrate, wherein the well region is used as a contact region that is in contact with a bottom end of each vertical active region.

24. The method according to claim 23, further comprising:
   doping, at least a bottom end of the semiconductor material in the each vertical active region, into a same conductive type as the contact region, wherein the doped portion overlaps, in a lateral direction, with a lowermost electrode layer of the first electrode layer and the second electrode layer.

25. The method according to claim 15, wherein the semiconductor material in the each vertical active region has a tubular shape with a closed bottom.

* * * * *